(12) United States Patent
Wang et al.

(10) Patent No.: US 9,746,511 B2
(45) Date of Patent: Aug. 29, 2017

(54) ESTIMATING THE LOCATIONS OF POWER SYSTEM EVENTS USING PMU MEASUREMENTS

(71) Applicant: HITACHI, LTD., Chiyoda-ku (JP)

(72) Inventors: Alex Wang, Santa Clara, CA (US); Hsiu-Khuern Tang, Santa Clara, CA (US); Bo Yang, Santa Clara, CA (US); Jun Yamazaki, Santa Clara, CA (US)

(73) Assignee: Hitachi, Ltd., Tokyo (JP)

( * ) Notice: Subject to any disclaimer, the term of this patent is extended or adjusted under 35 U.S.C. 154(b) by 110 days.

(21) Appl. No.: 14/952,533

(22) Filed: Nov. 25, 2015

(65) Prior Publication Data

US 2017/0146585 A1    May 25, 2017

(51) Int. Cl.
    *G01R 31/08*   (2006.01)
    *G01P 3/42*    (2006.01)
    (Continued)

(52) U.S. Cl.
    CPC .......... *G01R 31/086* (2013.01); *G01R 23/02* (2013.01); *G01R 31/08* (2013.01); *G01P 3/00* (2013.01);
    (Continued)

(58) Field of Classification Search
    CPC ...... G01R 31/00; G01R 31/08; G01R 31/086; G01R 31/11; G01R 23/00; G01R 23/02; G01P 3/00; G01P 3/50; G01P 7/00
    (Continued)

(56) References Cited

U.S. PATENT DOCUMENTS

| | | | | |
|---|---|---|---|---|
| 4,855,861 A | * | 8/1989 | Bergman | ............... H02H 7/26 324/512 |
| 6,301,308 B1 | * | 10/2001 | Rector | .................. H04L 27/24 375/259 |

(Continued)

FOREIGN PATENT DOCUMENTS

CN          102931728 B       12/2014

OTHER PUBLICATIONS

Zhang, Zhenghao, et al., "Time Synchronization Attack in Smart Grid: Impact and Analysis", 12 pages, IEEE Transactions on Smart Grid, vol. 4, No. 1, Mar. 2013. 1949-3053 Copyright 2013 IEEE.

(Continued)

*Primary Examiner* — Hoai-An D Nguyen
(74) *Attorney, Agent, or Firm* — Procopio, Cory, Hargreaves & Savitch LLP

(57) ABSTRACT

Example implementations described herein are directed to detection of anomalous events and locations on the transmission power system using phasor management unit (PMU) data, which provides information to grid operators for online decision support. From the high-resolution time synchronized PMU data, the transient abnormal events can be monitored and locations can be disclosed to operators for remedy actions. Utilization of PMU information for such decision support compliments operation practices relying on supervisory control and data acquisition (SCADA) measurements at much lower data resolution. Accurate identification of event locations can further advise grid operators the root cause of disturbances and illuminate possible cascading failures. Implementations of the proposed technology may improve the resilience and reliability of the transmission power systems.

20 Claims, 8 Drawing Sheets

(51) Int. Cl.
G01P 7/00 (2006.01)
G01R 23/02 (2006.01)
G01P 3/00 (2006.01)
G01P 3/50 (2006.01)
G01R 31/11 (2006.01)

(52) U.S. Cl.
CPC .................. G01P 3/50 (2013.01); G01P 7/00 (2013.01); G01R 31/11 (2013.01)

(58) Field of Classification Search
USPC ........ 324/500, 512, 535, 160, 161; 702/127, 702/142, 149
See application file for complete search history.

(56) References Cited

U.S. PATENT DOCUMENTS

| | | | | |
|---|---|---|---|---|
| 6,431,145 | B1* | 8/2002 | Denz | F02P 3/0554 123/406.24 |
| 7,138,924 | B2* | 11/2006 | Curtis | H02H 7/265 324/512 |
| 7,519,454 | B2 | 4/2009 | Gardner et al. | |
| 8,502,542 | B2* | 8/2013 | Couture | G01R 31/085 324/500 |
| 8,792,217 | B2 | 7/2014 | Shah et al. | |
| 8,892,375 | B2 | 11/2014 | Taft | |
| 8,907,525 | B2 | 12/2014 | El-Barbari et al. | |
| 8,942,954 | B2 | 1/2015 | Gong et al. | |
| 8,965,592 | B2 | 2/2015 | Manson | |
| 2004/0251894 | A1* | 12/2004 | Scotson | G01D 5/24452 324/207.2 |
| 2009/0122644 | A1* | 5/2009 | Hjorth | G01V 1/42 367/51 |
| 2012/0022707 | A1* | 1/2012 | Budhraja | H02J 3/008 700/292 |
| 2012/0254677 | A1* | 10/2012 | Hann | H04L 7/033 714/707 |
| 2016/0067500 | A1* | 3/2016 | Demmer | A61N 1/36542 607/18 |

OTHER PUBLICATIONS

Korkali, Mert, and Abur, Ali," Robust Fault Location Using Least-Absolute-Value Estimator", 9 pages. IEEE Transactions on Power Systems, vol. 28, No. 4, Nov. 2013. 0885-8950 Copyright 2013 IEEE.

Wang, Wei, et al., "Detection, Recognition, and Localization of Multiple Attacks through Event Unmixing", 6 pages. IEEESmartGridComm 2013 Symposium—Cyber-Physical Wide-Area Monitoring, Protection & Control (Cyber-Physical WAMPAC) 978-1-4799-1526-2/13 Copyright 2013 IEEE.

Chaitanya, B.K., et al., "Fault Location for Double-Circuit Transmission Lines Using Travelling-Wave Theory with Unsynchronized Measurements", 6 pages, 978-1-4678-6503-1 Copyright 2015 IEEE.

Jiang, Joe-Air, et a., "An Adaptive PMU Based Fault Detection/Location Technique for Transmission Lines—Part II: PMU Implementation and Performance Evaluation", 11 pages IEEE Transactions on Power Delivery, vol. 15, No. 4, Oct. 2000. 0885-8977/00 Copyright 2000 IEEE.

Tsai, Shu-Jen, et al., "Frequency Sensitivity and Electro-mechanical Propagation Simulation Study in Large Power Systems", 10 pages, IEEE Transactions on Circuits and Systems-I: Regular Papers, vol. 54, No. 8, Aug. 2007. 1549-8328 Copyright 2007 IEEE.

Wang, Yang, et al., "Algorithms and Field Experiences for Estimating Transmission Line Parameters Based on Fault Record Data", 9 pages, IET Generation, Transmission & Distribution 2015, vol. 9, Iss. 13, pp. 1773-1781, IET Journals, ISSN 1751-8687, Nov. 14, 2014 Copyright 2015, The Institution of Engineering and Technology.

Extended Search Report for European Patent Application No. 16198667.4, dated Apr. 18, 2017, 18 pages. European Patent Office, Munich, Germany.

Mei, Kejun, et al., "Clustering-Based Dynamic Event Location Using Wide-Area Phasor Measurements", 7 pages, IEEE Transactions on Power Systems, vol. 23, No. 2, May 2008. 0885-8950 Copyright 2008 IEEE.

Ali, Mahmoud, et al., "Improved Control Strategy to Mitigate Electromechanical Wave Propagation Using PSS", 6 pages, 978-1-4244-5795-3 Copyright 2010 IEEE.

* cited by examiner

ESTIMATING THE LOCATIONS OF POWER SYSTEM EVENTS USING PMU MEASUREMENTS

BACKGROUND

Field

The present disclosure relates to power systems, and more specifically, to management of power system events through phasor measurement units (PMUs).

Related Art

In the related art implementations, the location determination of power system disturbances has been researched. In one example from the related art, frequency responses of the system have been considered. In an example of a related art implementation, there is a system for detecting and locating a disturbance event within a power grid includes a series of frequency disturbance recorders (FDRs) taking measurements in the power grid at dispersed points of the power grid. In related art implementations, the information management system is configured to receive data from the series of FDRs and analyze the received data and a communications network interconnecting the series of FDRs and the information management system.

Another example related art implementation includes a system that determines the location of a disturbance event in a power distribution system. More specifically, the related art implementation provides a system for determining the direction of a disturbance event at the individual meter location and a system for analyzing this data from multiple meter locations to locate the cause of the event in the power system.

In another related art implementation, remote intelligent electronic devices (IEDs) may be configured to obtain information related to rotor angles, operating frequencies, rate of change of frequency, rotating inertia, and power consumption levels of loads and generators included in the electric power delivery system. The related art central IED may communicate with the remote IEDs to determine which loads and generators are associated with a sub-grid of the electric power delivery system and whether to disconnected certain loads or generators.

In another related art implementation, fault location is conducted on a non-homogeneous electric power line that includes a plurality of sections by determining a section in which negative-sequence voltage magnitude profiles calculated from each terminal of the power line intersect. The fault location may determine the faulted section and determine the location of the fault within the faulted section. To determine the fault location, the negative-sequence voltage magnitude profiles may be calculated from measurements taken at each terminal of the power line and compared to determine a point where the profiles intersect. The profiles may be calculated using power line properties and measurements from each terminal.

In another related art implementation islanding conditions in a grid are detected, which can involve ramping up an amount of reactive power, active power, or a combination of active and reactive power that is generated from a power conversion system until the earlier of the power conversion system shutting down or a threshold condition being reached.

In another related art implementation, there is an outage intelligence application receives event messages indicative of occurrences associated with various devices within a power grid. The outage intelligence application determines a state of the various devices based on the event messages. Based on the event messages, the outage intelligence application can determine and confirm an outage condition associate with a particular device.

In another related art implementation, there is a protection system which may utilize time-synchronized data in order to analyze data provided by systems having disparate sampling rates, which are monitored by different equipment, and/or equipment that is geographically separated.

SUMMARY

With high resolution, time-synchronized sensing schemes, PMUs can capture power system dynamics and transient switching events, such as line reclosing and breaker switching, the majority of which take place autonomously and may not be recorded. The use of PMUs may cause power operators to be inundated by massive amounts of data, which prevents them from recognizing critical grid information and abnormal behaviors and responding in a timely manner. Due to the lack of efficient online analysis methods, related art implementations of PMU data are primarily visualized for online monitoring and are rarely used for operational decision support.

There is a need for a system and method to automatically detect "events" that are not caused by normal load and generation variations, so that operators can be alerted early on and can take remedy actions in time. Such events include transient phenomenon (usually lasting less than one second) introduced by line breaker operation, reclosing, and faults, as well as steady state changes (lasting on the order of seconds) from topology and power flow variations, which are often seen in grid operations but are seldom monitored. Such a system should be robust, fast, and scalable, to be able to handle hundreds of PMUs and detect events in close to real time.

Example implementations of the present disclosure involve systems and methods to monitor PMU data continuously for anomalies, estimate the time and location of the event underlying each cluster of anomalies occurring close together in time that affects three or more PMUs; and incorporate information about the power grid topology to improve the estimation of event time and location.

Aspects of the present disclosure include a method for event detection for a system having a plurality of PMUs. The method can involve estimating a propagation speed for each PMU in a set of PMUs indicating an anomaly from the plurality of PMUs, the propagation speed based on one or more events stored in a database; determining a first event location based on the estimated propagation speed for the each of the PMUs in the set of PMUs; adjusting the estimated propagation speed for each of the PMUs in the set of PMUs based on a distance between the first event location and one or more event locations stored in the database; and determining a second event location from the adjusting of the estimated propagation speed for each of the PMUs in the set of PMUs.

Aspects of the present disclosure include a non-transitory computer readable medium storing instructions for event detection for a system having a plurality of PMUs. The instructions can involve estimating a propagation speed for each PMU in a set of PMUs indicating an anomaly from the plurality of PMUs, the propagation speed based on one or more events stored in a database; determining a first event location based on the estimated propagation speed for the each of the PMUs in the set of PMUs; adjusting the estimated propagation speed for each of the PMUs in the set of PMUs based on a distance between the first event location and one or more event locations stored in the database; and determining a second event location from the adjusting of the estimated propagation speed for each of the PMUs in the set of PMUs.

Aspects of the present disclosure further include an apparatus configured to manage a plurality of power management units (PMUs). The apparatus can involve a processor, configured to estimate a propagation speed for each PMU in a set of PMUs indicating an anomaly from the plurality of PMUs, the propagation speed based on one or more events stored in a database; determine a first event location based on the estimated propagation speed for the each of the PMUs in the set of PMUs; adjust the estimated propagation speed for each of the PMUs in the set of PMUs based on a distance between the first event location and one or more event locations stored in the database; and determine a second event location from the adjusting of the estimated propagation speed for each of the PMUs in the set of PMUs.

Aspects of the present disclosure further include an apparatus configured to manage a plurality of power management units (PMUs). The apparatus can involve means for estimating a propagation speed for each PMU in a set of PMUs indicating an anomaly from the plurality of PMUs, the propagation speed based on one or more events stored in a database; means for determining a first event location based on the estimated propagation speed for the each of the PMUs in the set of PMUs; means for adjusting the estimated propagation speed for each of the PMUs in the set of PMUs based on a distance between the first event location and one or more event locations stored in the database; and means for determining a second event location from the adjusting of the estimated propagation speed for each of the PMUs in the set of PMUs.

Aspects of the present disclosure may further include a method, which can involve generating a vector for each of a plurality of buses, the vector indicative of a distance between the each of the plurality of the plurality of buses and each PMU in a set of PMUs, for each vector, ranking the distance between the bus and the PMUs, comparing each vector to a time vector indicative of a ranking based on an occurrence of an event in time for each PMU in the set of PMUs, and providing a vector having a minimum distance to the vector.

BRIEF DESCRIPTION OF DESCRIPTION

DETAILED DESCRIPTION

Figure 1:
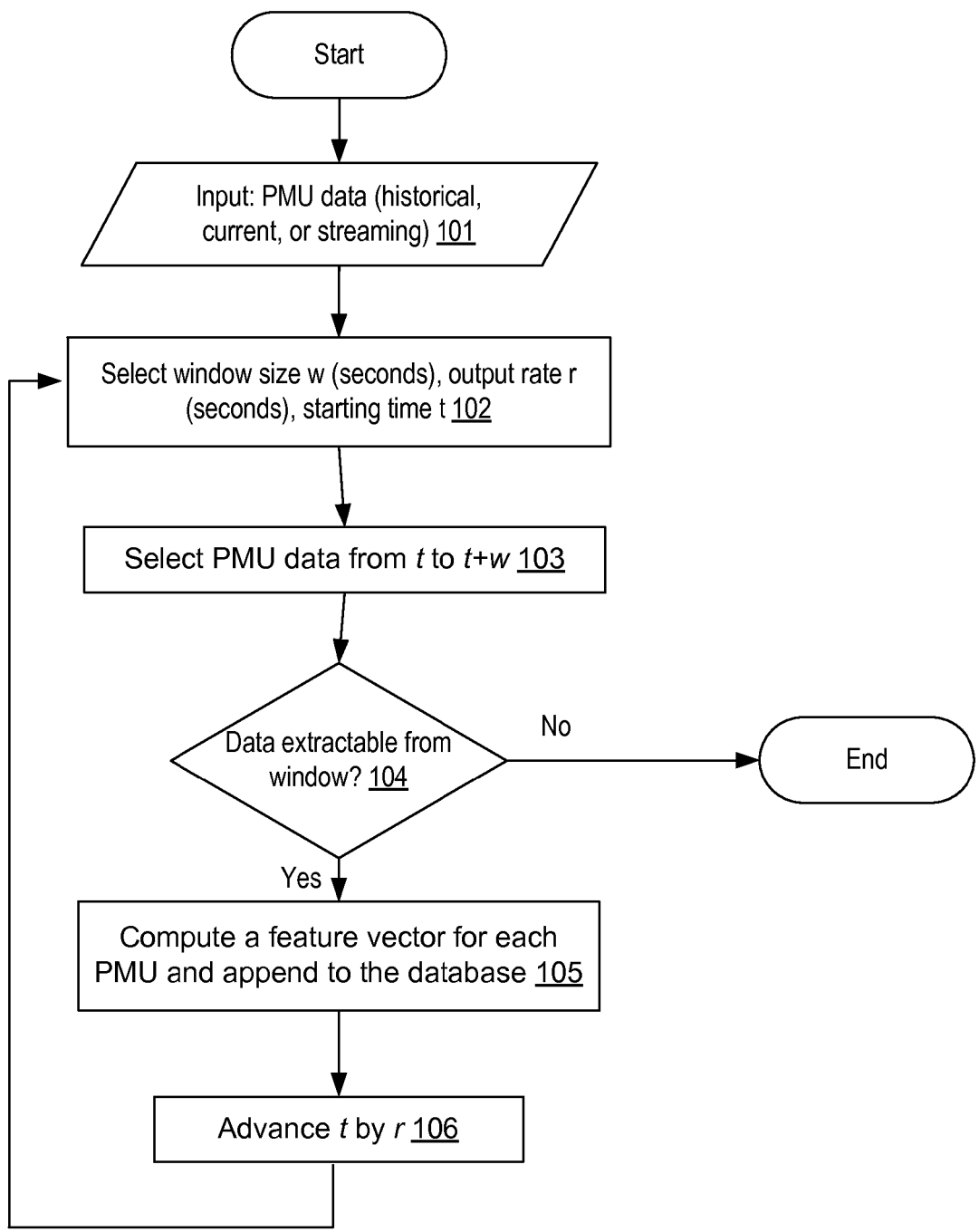
FIG. 1 illustrates an example flow diagram for feature generation, in accordance with an example implementation.

The following detailed description provides further details of the figures and example implementations of the present application. Reference numerals and descriptions of redundant elements between figures are omitted for clarity. Terms used throughout the description are provided as examples and are not intended to be limiting. For example, the use of the term "automatic" may involve fully automatic or semi-automatic implementations involving user or administrator control over certain aspects of the implementation, depending on the desired implementation of one of ordinary skill in the art practicing implementations of the present application.

Example implementations involve a method to detect anomalies in the PMU data, which can be implemented as an anomaly detection module. The anomalies may arise from various power system events, such as transient phenomena (usually lasting less than one second) introduced by line breaker operation, reclosing, and faults, as well as steady state changes (lasting on the order of seconds) from topology and power flow variations. Our method is robust, fast, and scalable, making it suitable for use in real-time detection.

The input to the anomaly detection module is a set of time series data collected by PMUs. The basic series are frequency and the voltage and current phasors (i.e., amplitude and phase); they are reported at a fixed frequency, such as 30 Hz. The data may be historical, streaming, or both. The output of the anomaly detection module is a set of times and PMUs at which anomalies have been detected, and a number for each anomaly that indicates the magnitude or severity.

Example implementations feature two aspects, including feature generation and anomaly monitoring. For feature generation, the input is the historical PMU data. FIG. 1 illustrates an example flow diagram for feature generation, in accordance with an example implementation. At 101, PMU data is processed as input, including historical, current or streaming data. At 102, a window size w (e.g., seconds), output rate r (e.g., seconds), and starting time t are selected. At 103, a window is taken from the PMU data from t to t+w seconds. At 104, a determination is made as to whether PMU data can be extracted from the window. If so (Yes), then the flow proceeds to 105. Otherwise (No), the flow ends.

At 105, a vector of features is computed for each PMU, from the PMU data found in the window. Examples of features can include the maximum Fourier amplitude, maximum spectral density, maximum difference of each data series, and others depending on the desired implementation. For example, other possible features can include the maximum absolute values of the wavelet coefficients at different resolutions. Features can also be calculated from more than one data series, such as the above features applied to the phase angle difference between the voltage phaser at the current PMU and some reference PMU.

At 106, the start time t is advanced by r seconds and the flow proceeds back to 102 to repeat the above calculations over sliding windows of the available data Each of the feature vector time series is stored in a database.

Figure 2:
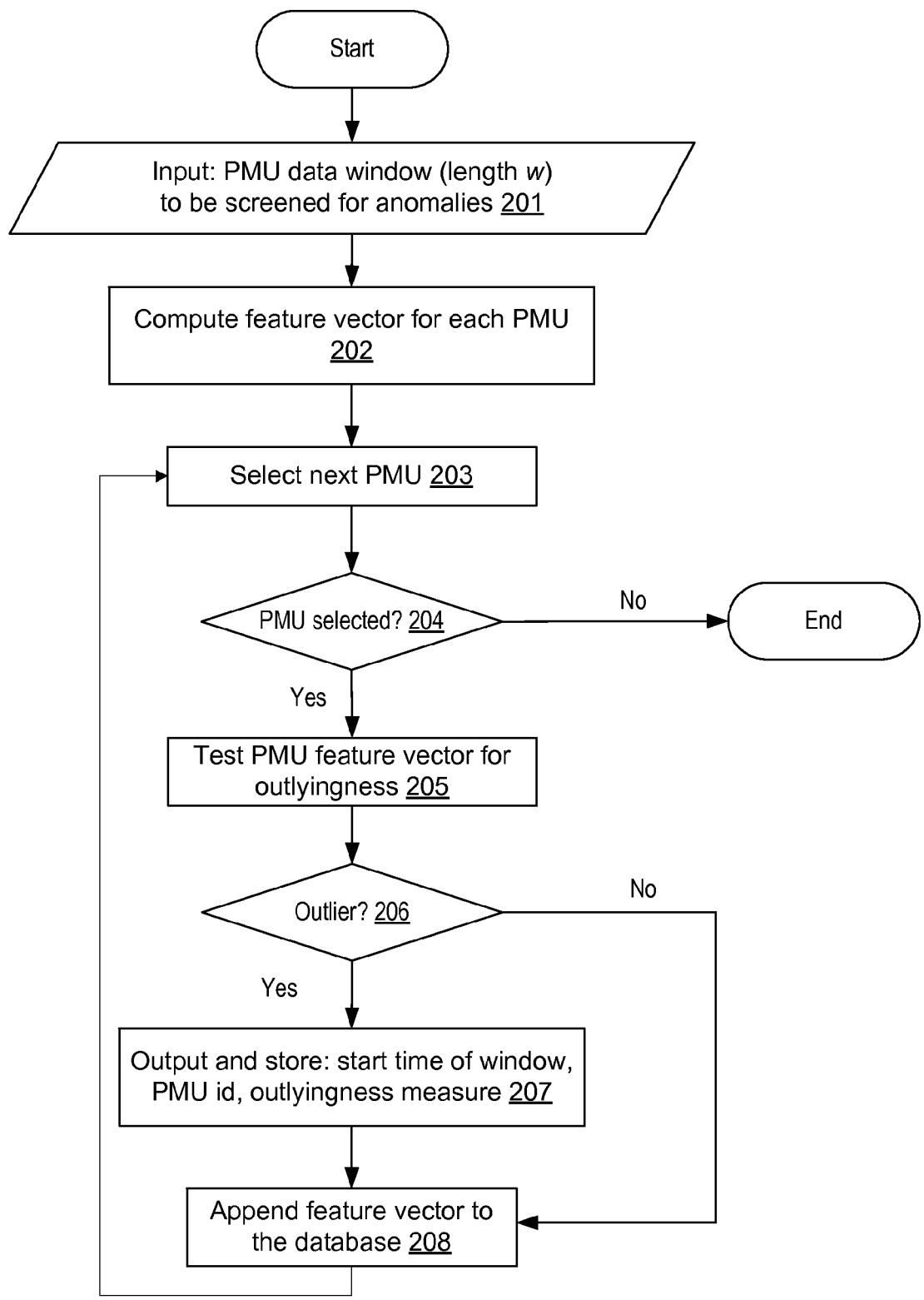
FIG. 2 illustrates a flow diagram for anomaly monitoring, in accordance with an example implementation.

For anomaly monitoring, the input is a new window of w seconds of PMU data to be screened for anomalies. FIG. 2 illustrates a flow diagram for anomaly monitoring, in accordance with an example implementation. At 201, a PMU data window of length w is processed as input to be screened for anomalies. At 202, the feature vector for each PMU is computed, as described above with respect to FIG. 1. At 203, a PMU is selected and at 204 if there are no PMUs left for selection (No) then the process ends, otherwise (Yes), the flow proceeds to 205 wherein for each PMU selected, an outlier detection test is applied on the feature vector corresponding to the PMU to determine if the feature vector is an outlier relative to the feature vectors previously calculated and stored. The test can be based on computing the outlyingness of individual features in the vector (e.g., the number of standard deviations away from the mean), and combining them by some weighting method to determine the outlyingness of the vector. The test can also be multivariate and use two or more (e.g., all) of the features jointly to estimate the distance of the vector from previous feature vectors.

At 206, a check is performed to determine if the feature vector is an outlier. Outlier can be implemented according to the desired implementation, such as comparison of individual features of a data vector received from the PMU, Fourier transforms to compare power measurements and standard deviations, voting methods for determining standard deviations, and so on. If so (Yes), then the window contains an anomaly and thus the start time of the window, the PMU, and the outlyingness measure are output and appended to the database at 207. If not (No), then the flow at 207 is skipped and proceeds to 208, wherein the calculated feature vector is appended to the database and then the flow proceeds back to 203. By applying the anomaly monitoring method on sliding windows of new PMU data as they become available, example implementations can detect anomalies in close to real time (e.g. within minutes of occurrence).

In example implementations, there is a time and location module configured to estimate the time and location of the event underlying each cluster of anomalies occurring close together in time that affects three or more PMUs. In descriptions herein, one such event is assumed for each cluster. The inputs to this module can include a set of previous events in the power grid. The actual or estimated times and locations of these events are assumed to be known from some other data source and/or analysis, depending on the desired implementation. Further inputs can include the current cluster of anomalies for which an estimate of the underlying event is sought. From the anomaly detection module, the time, PMU, and magnitude of each anomaly in the cluster can be known. The output is the estimated time and location of the event underlying the current cluster of anomalies.

In example implementations, there is a geographic location based method, which is configured for detecting the location of abnormal events in a wide area power grid, such as the Eastern and Western interconnections, when the topology information of the whole grid is not available, which is likely since the data is spread across multiple operators. In lieu of the missing topology information, the geographic location may be used for both events and PMUs.

Related art implementations utilize a single estimate for the event propagation speed in a large region; for example a speed of 500 mile/s within the Eastern Interconnect (EI) and a speed of 1,100 mile/s within the Western Electricity Coordinating Council (WECC). However, the speed of event propagation depends on the power company, the travel path, and other factors. In reality, the speed can vary from 100 mile/s to more than 1,000 mile/s. Using only a single or a small number of propagation speeds in a large region may result in an estimated location that is far from the actual location.

Figure 3:
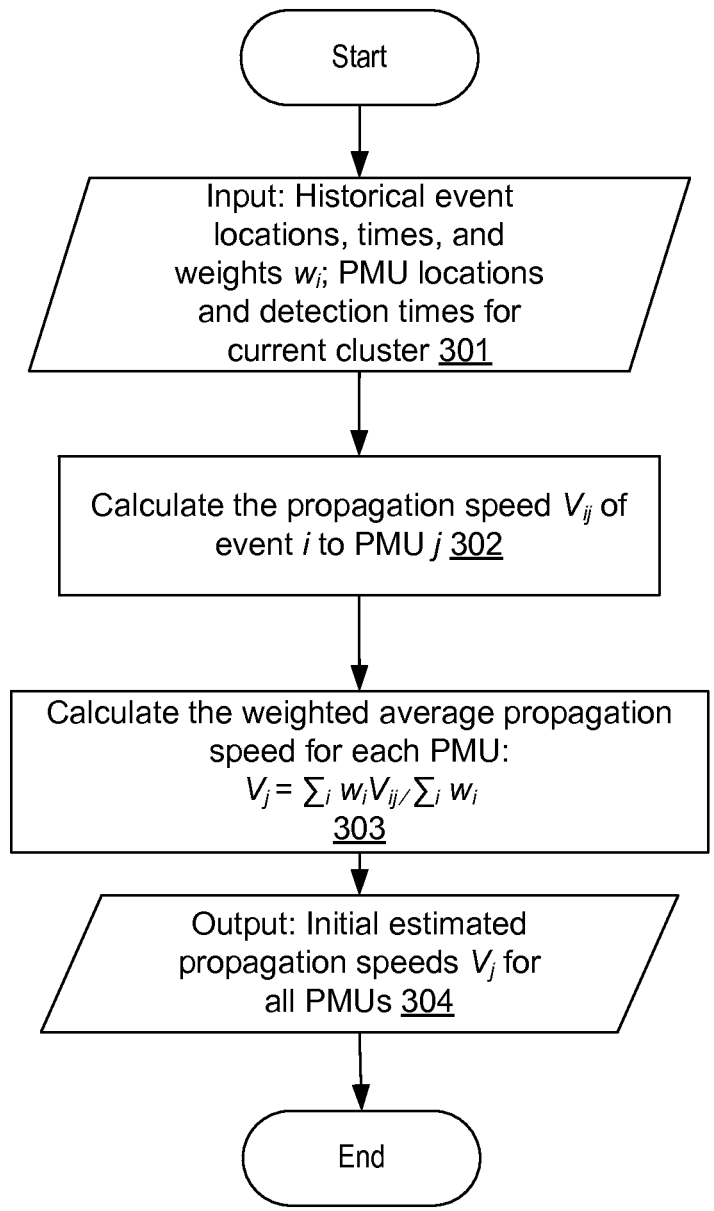
FIG. 3 illustrates an example flow diagram for propagation speed estimation using weights, in accordance with an example implementation.

In example implementations, a method utilizes data about historical events to obtain a better estimate of the propagation speed and thus derive more accurate location information. FIG. 3 illustrates an example flow diagram for propagation speed estimation using weights, in accordance with an example implementation. At 301, inputs are processed including historical event locations, times, and weights $w_i$, PMU locations and detection times for a given cluster. At 302, a calculation of the propagation speed $v_{ij}$ is performed for event I to PMU j. At 303, the weighted average propagation speed is calculated for each PMU by utilizing the equation:

At 304, the initial estimated propagation speeds $V_j$ for all PMUs is output.

For the notation for the input and output data, let the historical event data be $$E=\{E_1, E_2, E_3, \ldots, E_k\}$$

$$E_i=[x_i, y_i, t_i], \quad (1)$$

Where $(x_i, y_i)$ are the geographical coordinates of event $E_i$ and $t_i$ is its time of occurrence. Let the PMUs be $$P_1, P_2, P_3, \ldots, P_t,$$

With $P_j$ located at geographical coordinates $(u_j, v_j)$, and arranged such that the first m PMUs are the members of the current anomalous cluster sorted in increasing order of their anomaly times:

$$s_1 \leq s_2 \leq s_3 \leq \ldots \leq s_m. \quad (2)$$

The desired output is the location (x, y) and time t of a hypothesized event E that led to the observations in (2).

Figure 4:
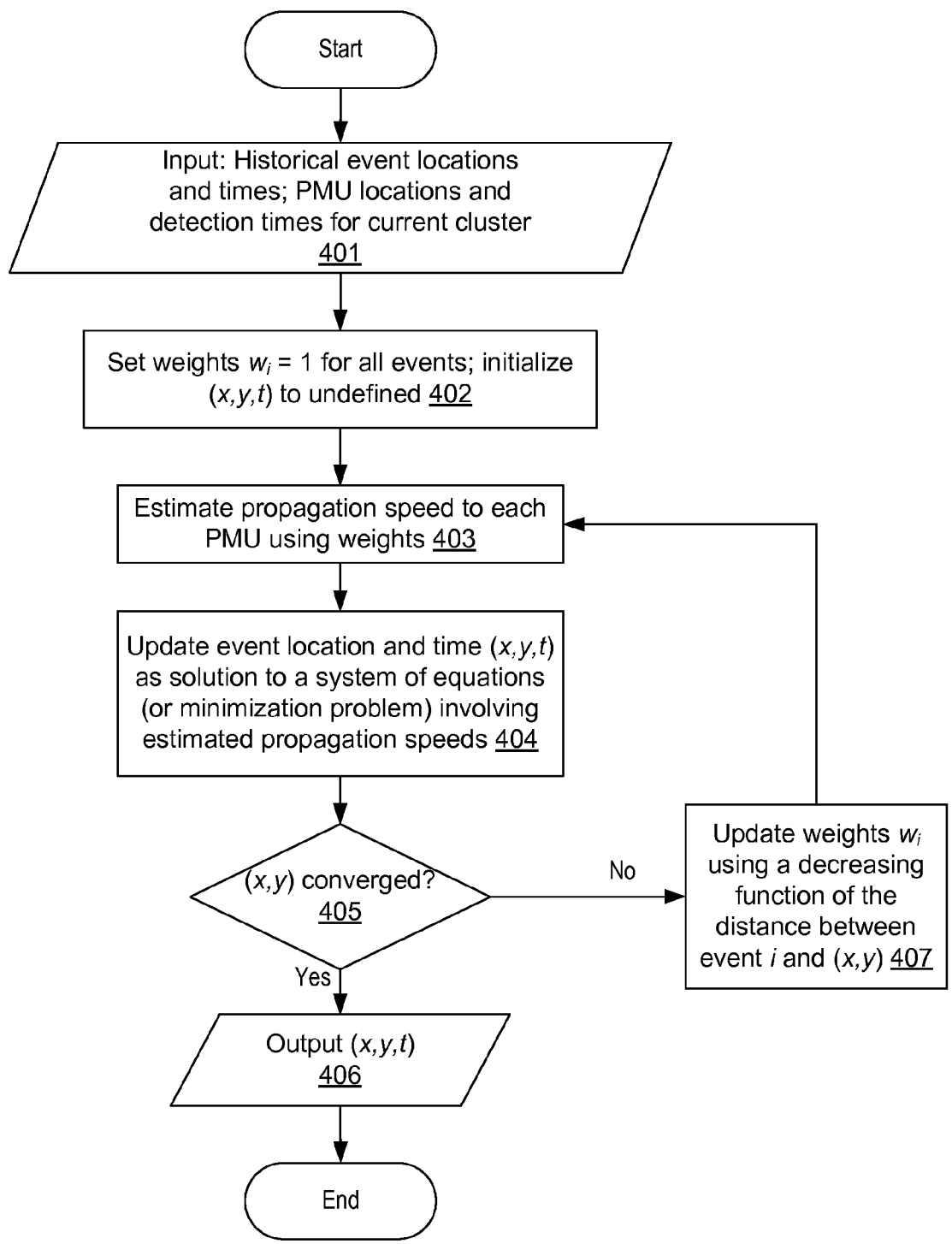
FIG. 4 illustrates an example flow diagram for geography-based location detection, in accordance with an example implementation.

FIG. 4 illustrates an example flow diagram for geography-based location detection, in accordance with an example implementation. Specifically, FIG. 4 illustrates how to estimate (x, y, t). At 401, input of historical event locations and times, PMU locations, and detection times for the current cluster is processed. The processing can include removing anomalies from the input. For example, the anomaly detection module is applied to the historical events to obtain the anomaly times in the historical PMU data caused by those events, denoted by $$(s1j, s2j, \ldots, skj),$$

where $s_{ij}$ is the time when event $E_i$ is detected at PMU $P_j$, if $E_i$ is not detected at PMU $P_j$, then $s_{ij}$ is left undefined.

At 402, the weights $w_i$ are set to 1 for all events, and (x, y, t) is also initialized. At 403, the propagation speed is estimated for all PMUs based on the weights by using the flow as illustrated in FIG. 3. Let $v_{ij}$ denote the speed of the propagation of event $E_i$ to PMU $P_j$:

$$V_{ij} = \frac{\sqrt{(u_j - x_i)^2 + (v_j - y_i)^2}}{s_{ij} - t_i}$$

Euclidian distance is used here as an example; however, other implementations, such as the Great Circle distance, can be utilized depending on the desired implementations. Then, for each PMU $P_j$, the following initial estimate of the propagation speed is formed from any event location to $P_j$:

$$V_j=\text{average}\{V_{ij}\},$$

where the average is taken over the values of $V_{ij}$ that are defined. At 404, the event location and time (x, y, t) are updated as a solution to a system of equations (or minimization problem) involving estimated propagation speeds. That is, an estimate of (x, y, t) is obtained by solving the following equations involving the three PMUs, such as $P_1$, $P_2$, and $P_3$, with the earliest times and with defined speeds:

$$(u_1-x)^2+(v_1-y)^2=V_1^2(s_1-t)^2$$

$$(u_2-x)^2+(v_2-y)^2=V_2^2(s_2-t)^2$$

$$(u_3-x)^2+(v_3-y)^2=V_3^2(s_3-t)^2$$

At 405, a check is performed to detect a convergence in (x, y), that is (x, y) being within a threshold of the previously found (x, y). If so (Yes), then (x, y, t) is output as the event location at 406. If not (No), then the flow proceeds to 407 wherein weights $w_i$ are updated using a decreasing function of distance between event i and (x,y). At 407, the weights are computed $$w_i = [(x_i - x)^2 + (y_i - y)^2]^{-1/2}$$

that are inversely proportional to the distance between the estimated location and each historical event $E_i$. The estimate of the propagation speed to $P_j$ is updated:

$$V_j = \frac{\Sigma_i w_i V_{ij}}{\Sigma_i w_i}$$

where the sums in the numerator and denominator are over values of i such that $v_{ij}$ that are defined. The flow then proceeds back to 403 to re-estimate (x, y, t). Thus, the flow may iterate until the change in the estimated location (x, y) is below some threshold. The reason for updating the propagation speed is as follows. The propagation speed to a PMU $P_j$ depends on the propagation path and other factors. If two events are close to each other, they may be more likely to have a similar path to $P_j$, and hence their propagation speeds are also similar. Therefore, once there is an initial guess of the event location E, more weight can be given to the historical events that are closer to E when estimating the propagation speed from E to $P_j$.

In example implementations, by re-estimating the propagation speed to each PMU, a more accurate estimate of the event location may be obtained compared to the related art implementations.

The flow of FIG. 4 may also be altered depending on the desired implementation. For example, one possible variation is to replace the flow at 404 to obtain an estimate of (x, y, t) by minimizing the following quantity:

$$\sum_j \left[ \sqrt{(u_j - x)^2 + (v_j - y)^2} - V_j(s_j - t) \right]^2,$$

where the sum is over the PMUs with defined speeds. The above solution minimizes the average sum-of-squares of the differences between the location-derived and speed-derived distances from E to $P_j$.

Another variation is to compute the weights in the flow at 407 as follows:

$$w_i = \exp\{-\lambda[(x_i - x)^2 + (y_i - y)^2]\},$$

where $\lambda \geq 0$ is a parameter. If $\lambda = 0$, the weighting is uniform; as $\lambda \to \infty$, the weighted average (at the flow of 407) tends towards the nearest neighbor estimate.

Further, the formula in the flow of 407 can be changed into an expression that expresses $V_j$ in terms of (x, y) for the flow at 404 (or its variant), and solve for (x, y) directly instead of iteratively. Other weighting methods based on distance or direction, may also be utilized, depending on the desired implementation.

In example implementations, there is a topology based method that focuses on wide area event time and location estimation when the grid topology is known, for example, when an operator, such as a utilities company, is considering the estimation within its own network only. Distance in such example implementations may involve electrical distance. The topology information about the grid network can be represented as a weighted graph. Nodes in the graph are buses and edges are branches that connect two buses as shown in tables 1 and 2 below. The weight of the branch between two buses is the electrical distance between them, which can be calculated from network characteristics such as impedances.

TABLE 1

Topology: Edge information (electric lines)

| Edge name | Start/End nodes | | Impedance R | Reactance X | Capacitance |
|---|---|---|---|---|---|
| a | A | B | 0.01 | 0.2 | 0.1 |
| b | B | C | 0.02 | 0.5 | 0.2 |
| . | . | . | . | . | . |
| . | . | . | . | . | . |
| . | . | . | . | . | . |

TABLE 2

Topology: Node information (buses)

| Node name | Location | | Generator | | | Load | | | Control Device | | |
|---|---|---|---|---|---|---|---|---|---|---|---|
| | Lat. | Long. | Name | Type | Capacity | Name | Type | Capacity | Name | Type | Capacity |
| A | 36.5 | 138.2 | G1 | Thermal | 100 | — | — | — | — | — | — |
| B | 37.7 | 140.5 | G2 | Wind | 200 | — | — | — | — | — | — |
| . | . | . | . | . | . | . | . | . | . | . | . |
| . | . | . | . | . | . | . | . | . | . | . | . |
| . | . | . | . | . | . | . | . | . | . | . | . |
| AA | 35.7 | 139.8 | — | — | — | L1 | Residential | 1000 | — | — | — |
| BB | 35.0 | 139.5 | — | — | — | L2 | Factory | 2000 | — | — | — |
| . | . | . | . | . | . | . | . | . | . | . | . |
| . | . | . | . | . | . | . | . | . | . | . | . |
| . | . | . | . | . | . | . | . | . | . | . | . |
| AAA | 36.3 | 139.0 | — | — | — | — | — | — | D1 | SC | 10 |
| BBB | 35.6 | 138.6 | — | — | — | — | — | — | D2 | ShR | 20 |
| . | . | . | . | . | . | . | . | . | . | . | . |
| . | . | . | . | . | . | . | . | . | . | . | . |
| . | . | . | . | . | . | . | . | . | . | . | . |

Compared with the geographic location based method, one possible advantage of the topology based method is that the topology based method may provide a more accurate location estimate. This is because two buses that are close together geographically may be far apart electrically (e.g., farther away in terms of electrical connections compared to actual physical separation distance), and in such situations the grid network that determines the propagation paths. Another possible advantage is that the topology based method may not require data about the locations and times of historical events.

Figure 5:
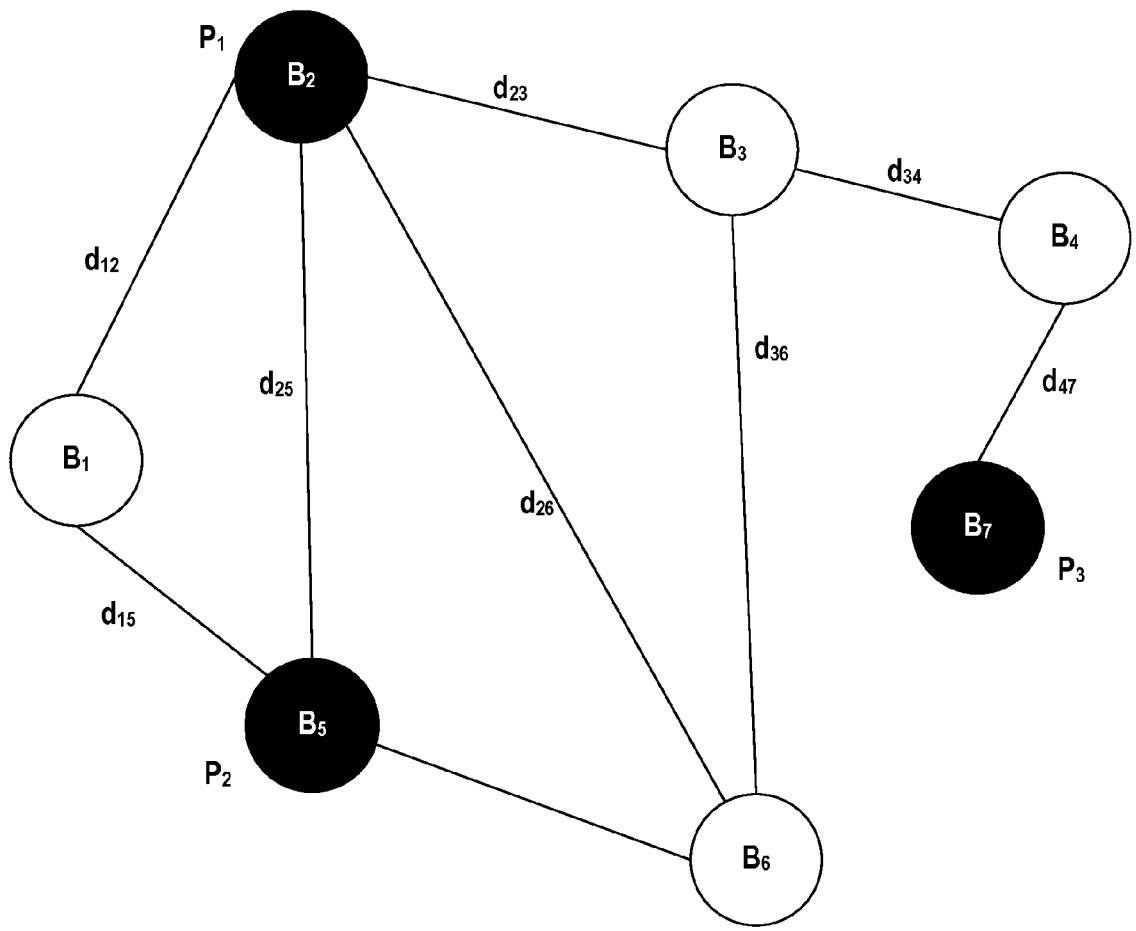
FIG. 5 illustrates an example weighted graph model of a power grid, in accordance with an example implementation.

An example of weighted graph model of power grid is shown in FIG. 5. Described below is notation for the input and output data. Denote the buses by $$B_1, B_2, B_3, \ldots, B_n.$$

PMUs are installed at a subset of the buses, say $$P_1, P_2, P_3, \ldots, P_l,$$

FIG. 5 illustrates an arrangement such that the first m PMUs are the members of the current anomalous cluster sorted in increasing order of their anomaly times:

$$S_1 \leq S_2 \leq S_3 \leq \ldots \leq S_m. \quad (3)$$

Let $D=[d_{ij}]$ denote the matrix of electrical distances between $B_i$ and $P_j$. This can be computed offline using the distance graph. Assume that events occur at buses. The desired output is the location $B_i$ and time t of a hypothesized event E.

Figure 6:
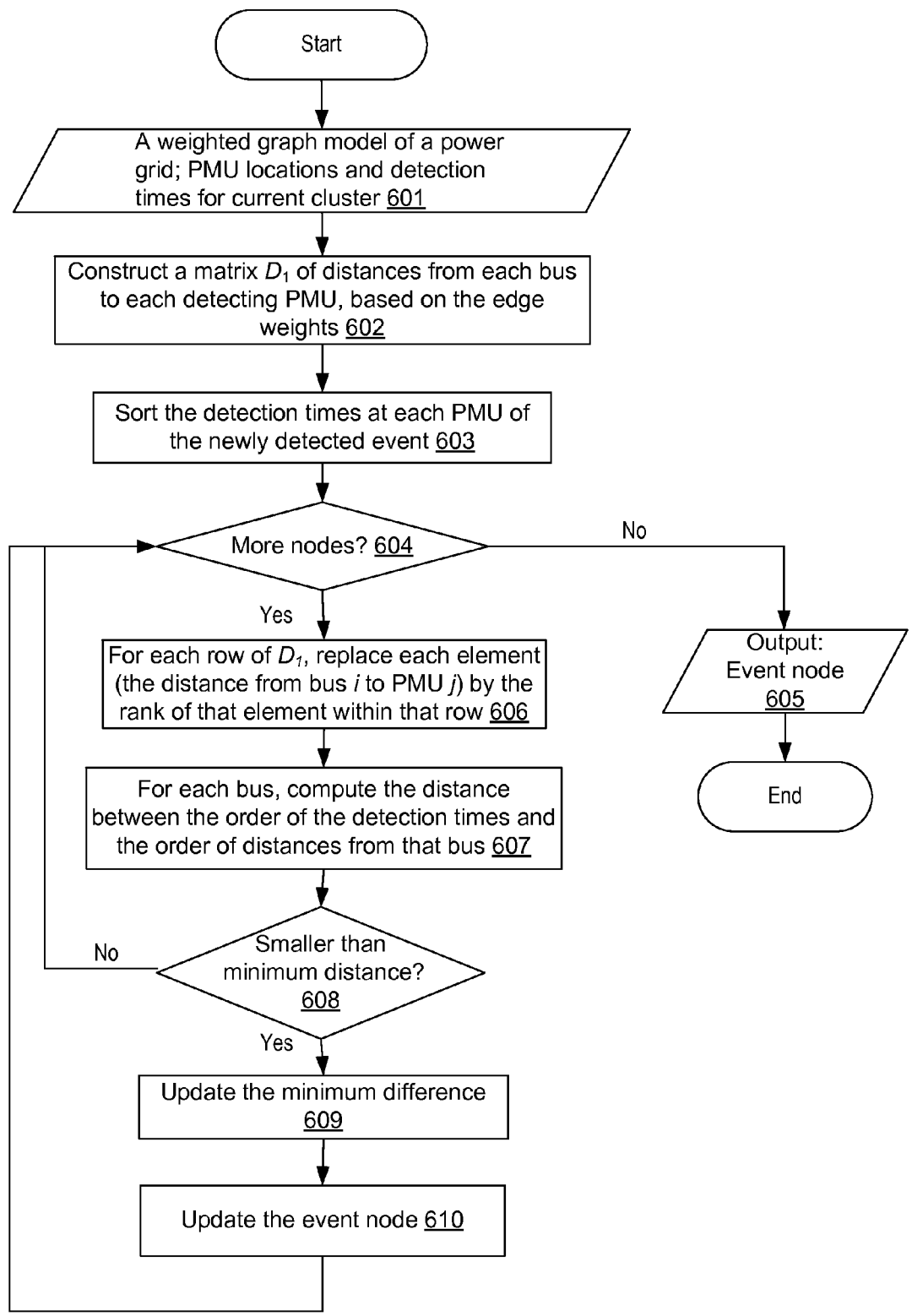
FIG. 6 illustrates a flow diagram for topology based location detection, in accordance with an example implementation.

FIG. 6 illustrates a flow diagram for topology based location detection, in accordance with an example implementation. Specifically, FIG. 6 illustrates a method for estimating (i, t). At 601, inputs, including a weighted graph model of a power grid, PMU locations and detection times for the current cluster, are processed. At 602, a matrix $D_1$ is constructed which includes the first m columns of D. These are the columns corresponding to the PMUs in the anomalous cluster, sorted in increasing order of the anomaly times. At 603, the detection times are sorted at each PMU for the newly detected event.

At 604, a check is determined if there are more nodes for processing. If so (Yes), then the flow proceeds to 606, otherwise (No) the flow proceeds to 605 to output the event node. At 606, for each row of $D_1$, the flow replaces each element (the distance from bus i to PMU j) by the rank of that element within that row. For example, if a row is already in increasing order, replace it by (1, 2, ..., m), if a row is (35, 25, 45, 80), replace it by (2, 1, 3, 4). At 607, for each row of $D_1$, the flow computes a distance $u_i$ between that row $R_i$ and the identity permutation I=(1, 2, ..., m). A smaller value of $u_i$ means that the bus is more likely to be close to the source event, since the order of the electrical distances to the PMUs agrees better with the observed order of the anomaly arrivals. There are several candidates for the distance that can be utilized depending on the desired implementation, such as Kendall-tau (the number of pairs in $R_i$ that are in opposite order to the corresponding pair in I), or Cayley (the minimum number of transposition (swaps) to change $R_i$ to the identity permutation). Cayley distance is equal to m minus the number of cycles in the permutation $R_i$. Cayley distance requires the absence of ties in $R_i$; and ties can be broken at random if necessary.

At 608, a determination is made as to whether the distance is smaller than a minimum threshold distance. If so (Yes), then the flow proceeds to 609 to update the minimum difference permitted, and at 610, the event node is updated. If not (No), then the flow proceeds back to 604 to process remaining nodes.

Output is provided at the flow at 605. Output can include output i=index(es) of the bus(es) with the smallest distance $u_i$, and Output $t=S_1$. Since the above calculations are based only on ranks, values oft do not have to be differentiated, as long as $t \leq S_1$.

In addition to the estimated event location $B_i$, the method as described in FIG. 6 also provides a score for sorting the buses according to how well the electrical distances agree with the anomaly arrival times. The same method can be utilized with the magnitudes (e.g., outlyingness measurements) from the anomaly detection module in place of the arrival times, depending on the desired implementation. This can provide a different score for ranking the buses, based on the assumption that the magnitude of the detected anomaly decreases as the event propagates. Further, the two scores can be combined by averaging or weighted averaging, and the result can be used to sort the buses and obtain another estimate for the event location $B_i$. This combined score has the advantage of using both the topology information as well as the information about the magnitudes of the detected anomalies.

Other variations of FIG. 6 may also be possible depending on the desired implementation. For example, at 602 m1 can be chosen, where 1<m1<m. Construct the matrix $D_1$ comprising the first m1 columns of D. In this example variation, not all the PMUs in the anomalous cluster are utilized; only the first few PMU's in the anomalous cluster are used to detect the anomaly. This allows the example implementations to use the PMUs that are likely to be closer to the event and to discard the rest.

Figure 7:
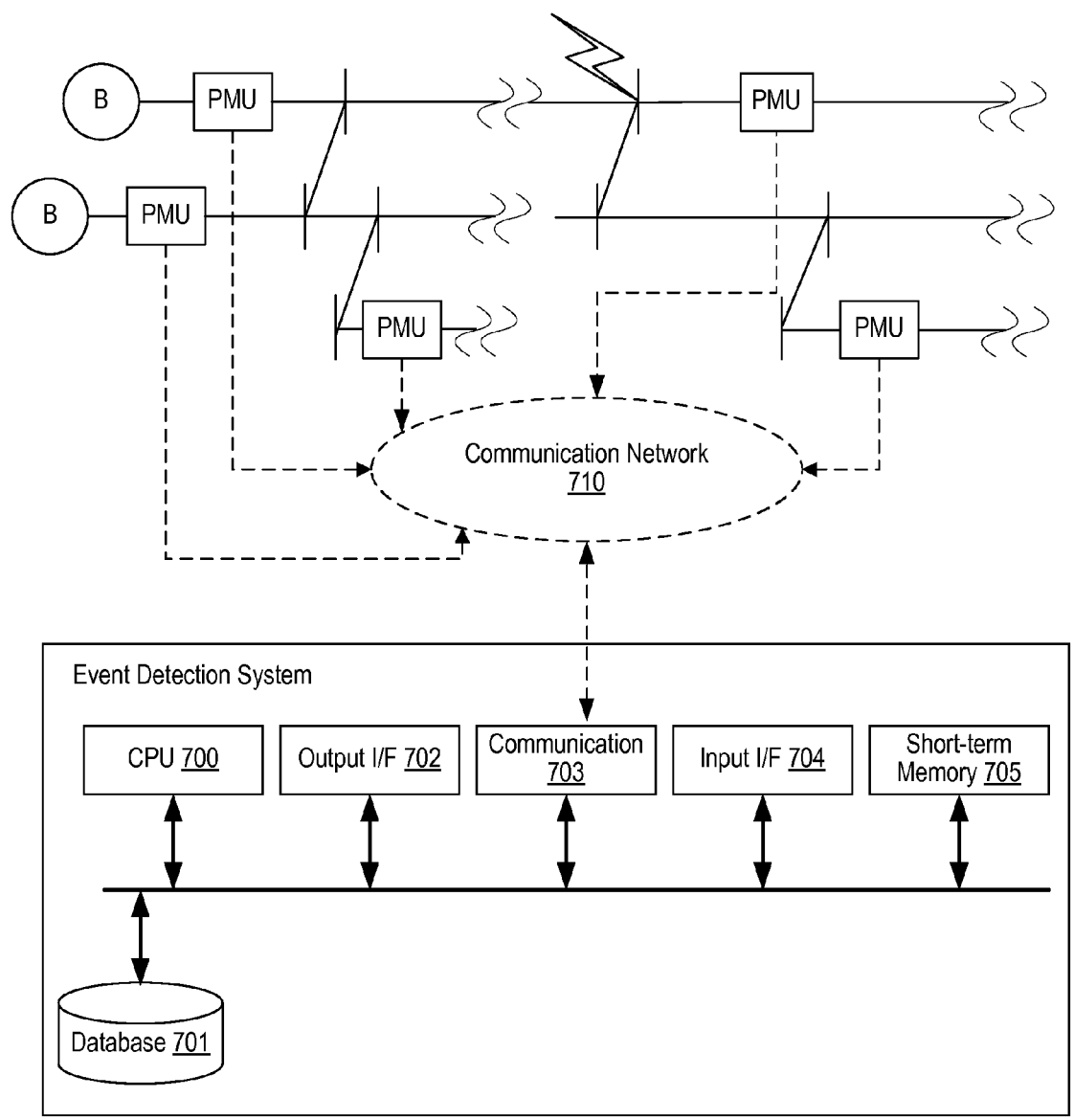
FIG. 7 illustrates a system diagram upon which example implementations may be applied.

FIG. 7 illustrates an example system upon which example implementations may be applied. The system can include PMUs applied along transmission lines, and electrical buses (designated as B) Event detection system is an apparatus that may be in the form of any system in accordance with a desired implementation (e.g., computer, data center, etc.). The event detection system may be configured to manage a plurality of PMUs in a power system, and can include a physical central processing unit (CPU) 700, database 701, output interface (I/F) 702, communication processor 703, input I/F 704, and short term memory 705 (e.g. cache). CPU 700 may execute one or more flows as illustrated in FIGS. 3, 4, and 6. Database 701 may be in the form of one or more storage devices configured to manage data measurements provided by PMUs. Output I/F 702 provides external output to the operator of the event detection system, such as displays, meter gauges, and so on. Communication processor 703 can function as an interface for receiving data from the PMUs through network 710 and conducting initial processing. Input I/F 704 provides interfaces for input from the operator, including keyboards, touchscreens, mouse and so on. Short term memory 705 can function as a cache for temporary storage of data streamed from PMUs.

In example implementations, the CPU 700 may be configured to estimate a propagation speed for each PMU in a set of PMUs indicating an anomaly from the plurality of PMUs, the propagation speed based on one or more events stored in a database 701 such as historical data as illustrated in FIGS. 1 and 3. CPU 700 may be configured to determine a first event location based on the estimated propagation speed for the each of the PMUs in the set of PMUs, adjust the estimated propagation speed for each of the PMUs in the set of PMUs based on a distance between the first event location and one or more event locations stored in the database; and determine a second event location from the adjusting of the estimated propagation speed for each of the PMUs in the set of PMUs as illustrated, for example in the flow of FIG. 4.

In example implementations, the CPU 700 may also be configured to, for the second event location being within a threshold distance of the first event location, provide an indication of the second event location as a source of an anomaly; and for the second event location not being within the threshold distance of the first event location: adjust the estimated propagation speed for each of the PMUs in the set of PMUs based on a distance between the second event location and one or more event locations stored in the database, change the first event location to the second event location; and re-determine the second event location from the adjusting of the estimated propagation speed for each of the PMUs in the set of PMUs as illustrated, for example, in the flow of FIG. 4.

For the second event location not being within the threshold distance of the first event location, the CPU 700 may be configured to iterates the adjustment of the estimated propagation speed for each of the PMUs in the set of PMUs based on a distance between the first event location and one or more event locations stored in the database, the change of the first event location to the second event location, and the re-determination of the second event location from the adjusting of the estimated propagation speed for each of the PMUs in the set of PMUs until the second event location is within the threshold distance of the first event location as illustrated in the flow of FIG. 4.

The CPU 700 is also configured to adjust the estimated propagation speed for each of the PMUs in the set of PMUs based on a distance between the first event location and one or more event locations stored in the database including the first event location into the one or more event locations stored in the database as illustrated in FIGS. 3 and 4, and is also configured to adjust the estimated propagation speed for each of the PMUs in the set of PMUs based on a distance between the second event location and one or more event locations stored in the database by including the first event location and the second event location into the one or more event locations stored in the database as illustrated in FIG. 4.

The CPU 700 is further configured to determine the set of PMUs indicating an anomaly from the plurality of PMUs based on a window of data from each of the plurality of PMUs, wherein the set of PMUs can involve more than one PMU as illustrated in FIGS. 3 and 4. Further, the CPU 700 is configured to estimate the propagation speed for each PMU in a set of PMUs indicating an anomaly from the plurality of PMUs, the propagation speed based on one or more events stored in a database, by determining the one or more event locations in the database from the one or more events in the database being associated with a PMU in the set of PMUs; and calculating an average propagation speed for the PMU in the set of PMUs based on a distance from each of the one or more event locations as illustrated in FIGS. 3 and 4. Further, CPU 700 may be further configured to adjust the estimated propagation speed for each of the PMUs in the set of PMUs based on the distance between the second event location and one or more event locations stored in the database by computing weights inversely proportional to distance between the second event location and each of the one or more event locations; and adjusting the average propagation speed for the PMU in the set of PMUs based on an application of the weights for each of the one or more event locations as illustrated in FIGS. 3 and 4.

In example implementations where the topology of the PMUs is known and electrical distances are also known as illustrated in FIG. 5 (e.g., stored in the database 701, the CPU may be further configured to generate a vector for each of a plurality of buses, wherein the vector is indicative of a distance between the each of the plurality of the plurality of buses and each PMU in a set of PMUs as described in FIG. 6. For each vector, CPU 700 may also rank the distance between the bus and the PMUs, compare each vector to a time vector indicative of a ranking based on an occurrence of an event in time for each PMU in the set of PMUs, and provide a vector having a minimum distance to the vector as illustrated with respect to the flow at FIG. 6.

Figure 8:
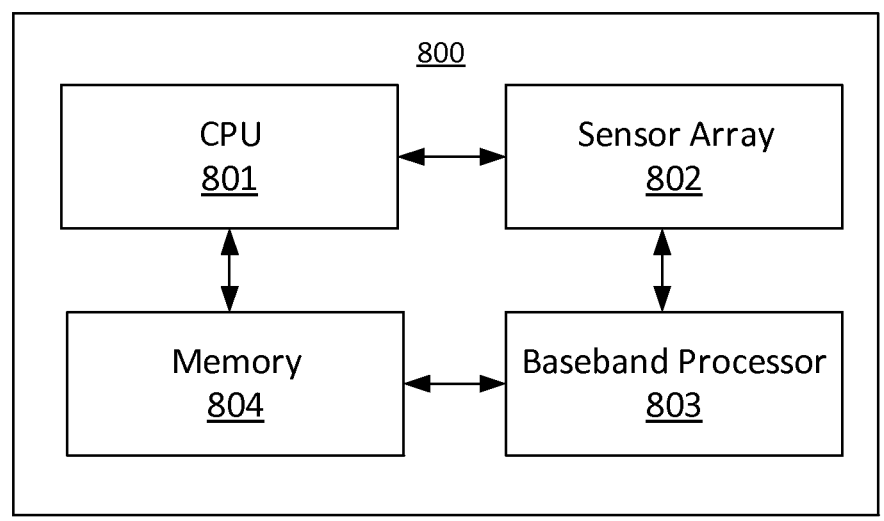
FIG. 8 illustrates an example diagram of a PMU, in accordance with an example implementation.

FIG. 8 illustrates a PMU in accordance with an example implementation. PMU may include a CPU 800, memory 801, sensor array 802 and baseband processor 803. Data from sensor array 802 is streamed to memory 801 and processed by CPU 800 to be prepared in a format for use by the receiving apparatus such as the event detection system of FIG. 7. Processed data is then transmitted to the receiving apparatus by baseband processor 803, which can be implemented as streaming data or batch data.

Some portions of the detailed description are presented in terms of algorithms and symbolic representations of operations within a computer. These algorithmic descriptions and symbolic representations are the means used by those skilled in the data processing arts to convey the essence of their innovations to others skilled in the art. An algorithm is a series of defined steps leading to a desired end state or result. In example implementations, the steps carried out require physical manipulations of tangible quantities for achieving a tangible result.

Unless specifically stated otherwise, as apparent from the discussion, it is appreciated that throughout the description, discussions utilizing terms such as "processing," "computing," "calculating," "determining," "displaying," or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. A computer-readable storage medium may involve tangible mediums such as, but not limited to optical disks, magnetic disks, read-only memories, random access memories, solid state devices and drives, or any other types of tangible or non-transitory media suitable for storing electronic information. A computer readable signal medium may include mediums such as carrier waves. The algorithms and displays presented herein are not inherently related to any particular computer or other apparatus. Computer programs can involve pure software implementations that involve instructions that perform the operations of the desired implementation.

Various general-purpose systems may be used with programs and modules in accordance with the examples herein, or it may prove convenient to construct a more specialized apparatus to perform desired method steps. In addition, the example implementations are not described with reference to any particular programming language. It can be appreciated that a variety of programming languages may be used to implement the teachings of the example implementations as described herein. The instructions of the programming language(s) may be executed by one or more processing devices, e.g., central processing units (CPUs), processors, or controllers.

As is known in the art, the operations described above can be performed by hardware, software, or some combination of software and hardware. Various aspects of the example implementations may be implemented using circuits and logic devices (hardware), while other aspects may be implemented using instructions stored on a machine-readable medium (software), which if executed by a processor, would cause the processor to perform a method to carry out implementations of the present application. Further, some example implementations of the present application may be performed solely in hardware, whereas other example implementations may be performed solely in software. Moreover, the various functions described can be performed in a single unit, or can be spread across a number of components in any number of ways. When performed by software, the methods may be executed by a processor, such as a general purpose computer, based on instructions stored on a computer-readable medium. If desired, the instructions can be stored on the medium in a compressed and/or encrypted format.

Moreover, other implementations of the present application may be apparent to those skilled in the art from consideration of the specification and practice of the teachings of the present application. Various aspects and/or components of the described example implementations may be used singly or in any combination. It is intended that the specification and example implementations be considered as examples only, with the true scope and spirit of the present application being indicated by the following claims.

What is claimed is:

1. A method for event detection for a system comprising a plurality of phasor measurement units (PMUs), the method comprising:
    estimating a propagation speed for each PMU in a set of PMUs indicating an anomaly from the plurality of PMUs, the propagation speed based on one or more events stored in a database;
    determining a first event location based on the estimated propagation speed for the each of the PMUs in the set of PMUs;
    adjusting the estimated propagation speed for each of the PMUs in the set of PMUs based on a distance between the first event location and one or more event locations stored in the database; and
    determining a second event location from the adjusting of the estimated propagation speed for each of the PMUs in the set of PMUs.

2. The method of claim 1, further comprising:
    for the second event location being within a threshold distance of the first event location, providing an indication of the second event location as a source of an anomaly;
    for the second event location not being within the threshold distance of the first event location:
        adjusting the estimated propagation speed for each of the PMUs in the set of PMUs based on a distance between the second event location and one or more event locations stored in the database;
        changing the first event location to the second event location; and
        re-determining the second event location from the adjusting of the estimated propagation speed for each of the PMUs in the set of PMUs.

3. The method of claim 2, wherein, for the second event location not being within the threshold distance of the first event location, the adjusting the estimated propagation speed for each of the PMUs in the set of PMUs based on a distance between the first event location and one or more event locations stored in the database, the changing the first event location to the second event location, and the re-determining the second event location from the adjusting of the estimated propagation speed for each of the PMUs in the set of PMUs, are iterated until the second event location is within the threshold distance of the first event location.

4. The method of claim 2, wherein the adjusting the estimated propagation speed for each of the PMUs in the set of PMUs based on a distance between the first event location and one or more event locations stored in the database comprises including the first event location into the one or more event locations stored in the database, and
    wherein the adjusting the estimated propagation speed for each of the PMUs in the set of PMUs based on a distance between the second event location and one or more event locations stored in the database comprises including the first event location and the second event location into the one or more event locations stored in the database.

5. The method of claim 1, further comprising determining the set of PMUs indicating an anomaly from the plurality of PMUs based on a window of data from each of the plurality of PMUs, wherein the set of PMUs comprises more than one PMU.

6. The method of claim 1, wherein the estimating the propagation speed for each PMU in a set of PMUs indicating an anomaly from the plurality of PMUs, the propagation speed based on one or more events stored in a database, comprises:
    determining the one or more event locations in the database from the one or more events in the database being associated with a PMU in the set of PMUs; and
    calculating an average propagation speed for the PMU in the set of PMUs based on a distance from each of the one or more event locations.

7. The method of claim 6, wherein the adjusting the estimated propagation speed for each of the PMUs in the set of PMUs based on the distance between the second event location and one or more event locations stored in the database comprises:
    computing weights inversely proportional to distance between the second event location and each of the one or more event locations; and
    adjusting the average propagation speed for the PMU in the set of PMUs based on an application of the weights for each of the one or more event locations.

8. A non-transitory computer readable medium, storing instructions for executing event detection for a system comprising a plurality of phasor measurement units (PMUs), the instructions comprising:
    estimating a propagation speed for each PMU in a set of PMUs indicating an anomaly from the plurality of PMUs, the propagation speed based on one or more events stored in a database;
    determining a first event location based on the estimated propagation speed for the each of the PMUs in the set of PMUs;

adjusting the estimated propagation speed for each of the PMUs in the set of PMUs based on a distance between the first event location and one or more event locations stored in the database; and determining a second event location from the adjusting of the estimated propagation speed for each of the PMUs in the set of PMUs.

9. The non-transitory computer readable medium of claim 8, the instructions further comprising:

for the second event location being within a threshold distance of the first event location, providing an indication of the second event location as a source of an anomaly;

for the second event location not being within the threshold distance of the first event location:

adjusting the estimated propagation speed for each of the PMUs in the set of PMUs based on a distance between the second event location and one or more event locations stored in the database;

changing the first event location to the second event location; and re-determining the second event location from the adjusting of the estimated propagation speed for each of the PMUs in the set of PMUs.

10. The non-transitory computer readable medium of claim 9, wherein, for the second event location not being within the threshold distance of the first event location, the adjusting the estimated propagation speed for each of the PMUs in the set of PMUs based on a distance between the first event location and one or more event locations stored in the database, the changing the first event location to the second event location, and the re-determining the second event location from the adjusting of the estimated propagation speed for each of the PMUs in the set of PMUs, are iterated until the second event location is within the threshold distance of the first event location.

11. The non-transitory computer readable medium of claim 9, wherein the adjusting the estimated propagation speed for each of the PMUs in the set of PMUs based on a distance between the first event location and one or more event locations stored in the database comprises including the first event location into the one or more event locations stored in the database, and wherein the adjusting the estimated propagation speed for each of the PMUs in the set of PMUs based on a distance between the second event location and one or more event locations stored in the database comprises including the first event location and the second event location into the one or more event locations stored in the database.

12. The non-transitory computer readable medium of claim 8, the instructions further comprising determining the set of PMUs indicating an anomaly from the plurality of PMUs based on a window of data from each of the plurality of PMUs, wherein the set of PMUs comprises more than one PMU.

13. The non-transitory computer readable medium of claim 8, wherein the estimating the propagation speed for each PMU in a set of PMUs indicating an anomaly from the plurality of PMUs, the propagation speed based on one or more events stored in a database, comprises:

determining the one or more event locations in the database from the one or more events in the database being associated with a PMU in the set of PMUs; and calculating an average propagation speed for the PMU in the set of PMUs based on a distance from each of the one or more event locations.

14. The non-transitory computer readable medium of claim 13, wherein the adjusting the estimated propagation speed for each of the PMUs in the set of PMUs based on the distance between the second event location and one or more event locations stored in the database comprises:

computing weights inversely proportional to distance between the second event location and each of the one or more event locations; and adjusting the average propagation speed for the PMU in the set of PMUs based on an application of the weights for each of the one or more event locations.

15. An apparatus configured to manage a plurality of phasor measurement units (PMUs), the apparatus comprising:

a processor, configured to:

estimate a propagation speed for each PMU in a set of PMUs indicating an anomaly from the plurality of PMUs, the propagation speed based on one or more events stored in a database;

determine a first event location based on the estimated propagation speed for the each of the PMUs in the set of PMUs;

adjust the estimated propagation speed for each of the PMUs in the set of PMUs based on a distance between the first event location and one or more event locations stored in the database; and determine a second event location from the adjusting of the estimated propagation speed for each of the PMUs in the set of PMUs.

16. The apparatus of claim 15, wherein the processor is configured to:

for the second event location being within a threshold distance of the first event location, provide an indication of the second event location as a source of an anomaly;

for the second event location not being within the threshold distance of the first event location:

adjust the estimated propagation speed for each of the PMUs in the set of PMUs based on a distance between the second event location and one or more event locations stored in the database;

change the first event location to the second event location; and re-determine the second event location from the adjusting of the estimated propagation speed for each of the PMUs in the set of PMUs.

17. The apparatus of claim 16, wherein, for the second event location not being within the threshold distance of the first event location, the processor iterates the adjustment of the estimated propagation speed for each of the PMUs in the set of PMUs based on a distance between the first event location and one or more event locations stored in the database, the change of the first event location to the second event location, and the re-determination of the second event location from the adjusting of the estimated propagation speed for each of the PMUs in the set of PMUs until the second event location is within the threshold distance of the first event location.

18. The apparatus of claim 16, wherein the processor is configured to adjust the estimated propagation speed for each of the PMUs in the set of PMUs based on a distance between the first event location and one or more event locations stored in the database including the first event location into the one or more event locations stored in the database, and wherein the processor is configured to adjust the estimated propagation speed for each of the PMUs in the set of PMUs based on a distance between the second event location and one or more event locations stored in the database by including the first event location and the second event location into the one or more event locations stored in the database.

19. The apparatus of claim 15, wherein the processor is configured to determine the set of PMUs indicating an anomaly from the plurality of PMUs based on a window of data from each of the plurality of PMUs, wherein the set of PMUs comprises more than one PMU.

20. The apparatus of claim 15, wherein the processor is configured to estimate the propagation speed for each PMU in a set of PMUs indicating an anomaly from the plurality of PMUs, the propagation speed based on one or more events stored in a database, by:
   determining the one or more event locations in the database from the one or more events in the database being associated with a PMU in the set of PMUs; and
   calculating an average propagation speed for the PMU in the set of PMUs based on a distance from each of the one or more event locations;
   wherein the processor is configured to adjust the estimated propagation speed for each of the PMUs in the set of PMUs based on the distance between the second event location and one or more event locations stored in the database by:
   computing weights inversely proportional to distance between the second event location and each of the one or more event locations; and
   adjusting the average propagation speed for the PMU in the set of PMUs based on an application of the weights for each of the one or more event locations.

* * * * *